(12) United States Patent
Pfeuffer

(10) Patent No.: US 10,388,694 B2
(45) Date of Patent: Aug. 20, 2019

(54) OPTOELECTRONIC COMPONENT, LIGHTING APPARATUS AND CAR HEADLIGHT

(71) Applicant: OSRAM Opto Semiconductors GmbH, Regensburg (DE)

(72) Inventor: Alexander F. Pfeuffer, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 16/065,000

(22) PCT Filed: Jan. 3, 2017

(86) PCT No.: PCT/EP2017/050083
§ 371 (c)(1),
(2) Date: Jun. 21, 2018

(87) PCT Pub. No.: WO2017/121659
PCT Pub. Date: Jul. 20, 2017

(65) Prior Publication Data
US 2019/0013351 A1 Jan. 10, 2019

(30) Foreign Application Priority Data
Jan. 11, 2016 (DE) .................. 10 2016 100 351

(51) Int. Cl.
*H01L 27/15* (2006.01)
*H01L 33/38* (2010.01)
(Continued)

(52) U.S. Cl.
CPC .......... *H01L 27/156* (2013.01); *F21S 41/141* (2018.01); *H01L 33/0079* (2013.01);
(Continued)

(58) Field of Classification Search
CPC ..... H01L 27/156; H01L 33/62; H01L 33/382; H01L 33/0079; H01L 27/15; F21S 41/141
(Continued)

(56) References Cited

U.S. PATENT DOCUMENTS 9,362,335 B2  6/2016  von Malm
9,666,756 B2  5/2017  von Malm et al.
(Continued)

FOREIGN PATENT DOCUMENTS

DE   102011102032 A    11/2012
DE   102011056888 A1    6/2013
(Continued)

*Primary Examiner* — Caleen O Sullivan
(74) *Attorney, Agent, or Firm* — Slater Matsil, LLP

(57) ABSTRACT

An optoelectronic component, a lighting apparatus and a car headlight are disclosed. In an embodiment an optoelectronic component includes a radiation side having a plurality of pixels arranged next to each other and a contact side, opposite of the radiation side, having a plurality of first contact structures, wherein a length of each pixel is greater than a width of the pixel, wherein the first contact structures are electrically contacted individually and independently of each other during operation, wherein each pixel is electrically uniquely associated with a first contact structure, and wherein, for each pixel and a pixel directly adjacent thereto, the two first contact structures of these two pixels are arranged differently with respect to the associated pixels so that a translation, which images the pixel in the directly adjacent pixel, does not image the two associated first contact structures congruently into each other.

19 Claims, 12 Drawing Sheets

(51) Int. Cl.
  *H01L 33/00* (2010.01)
  *F21S 41/141* (2018.01)
  *H01L 33/62* (2010.01)
(52) U.S. Cl.
  CPC ............ *H01L 33/382* (2013.01); *H01L 33/62* (2013.01); *H01L 27/15* (2013.01)
(58) Field of Classification Search
  USPC .................................................... 257/88, 72
  See application file for complete search history.

(56) References Cited

U.S. PATENT DOCUMENTS

| | | |
|---|---|---|
| 9,899,418 B2 | 2/2018 | Pfeuffer et al. |
| 9,917,077 B2 | 3/2018 | von Malm et al. |
| 2018/0151548 A1 | 5/2018 | Pfeuffer et al. |
| 2018/0166499 A1 | 6/2018 | Pfeuffer et al. |

FOREIGN PATENT DOCUMENTS

| | | |
|---|---|---|
| DE | 102012112302 A1 | 6/2014 |
| DE | 102013102667 A1 | 10/2014 |
| WO | 2014090605 A1 | 6/2014 |
| WO | 2016192939 A1 | 12/2016 |
| WO | 2016193071 A1 | 12/2016 |

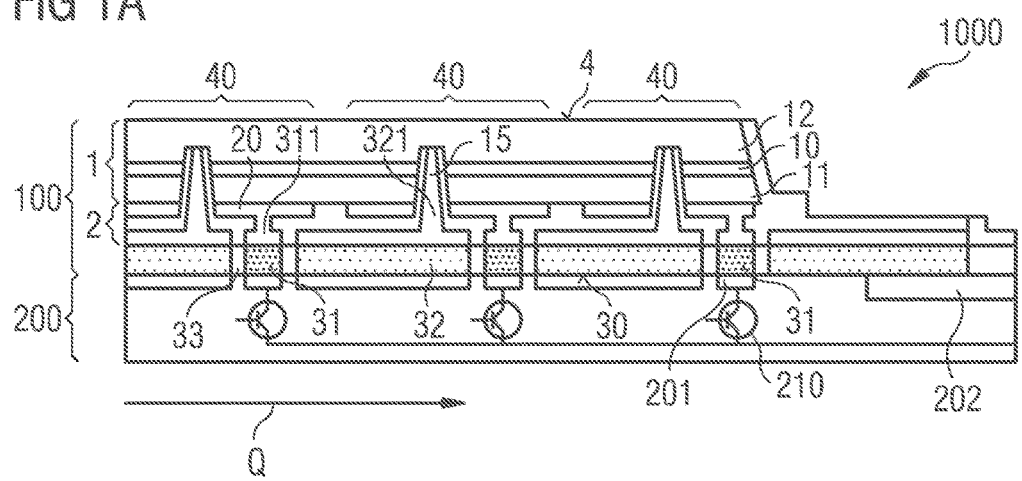
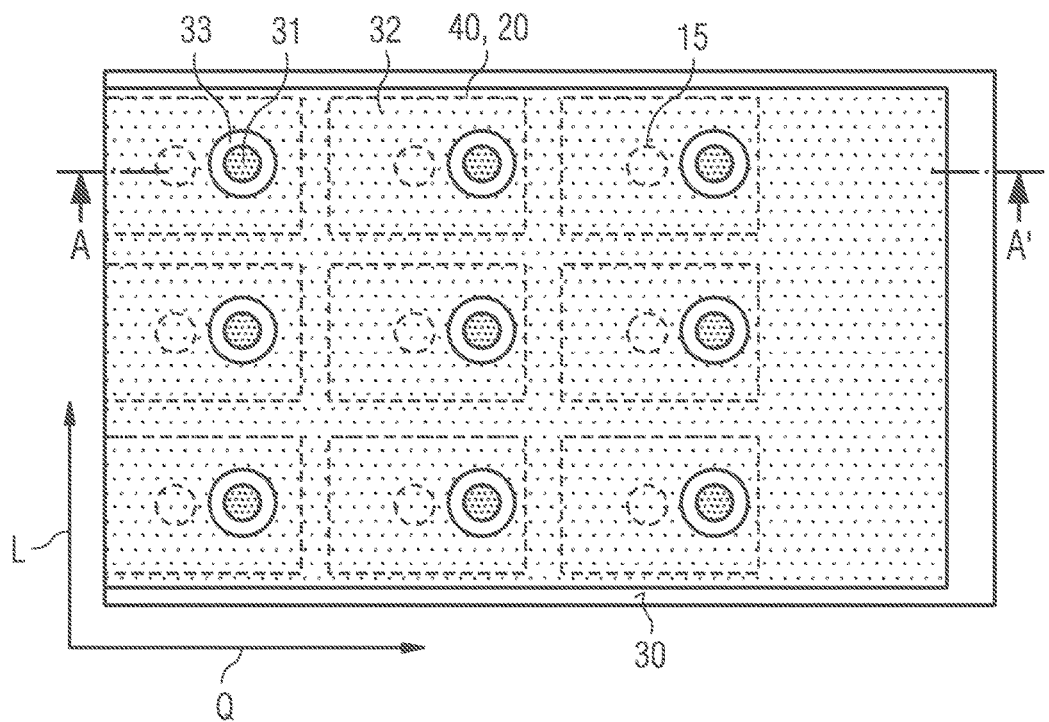

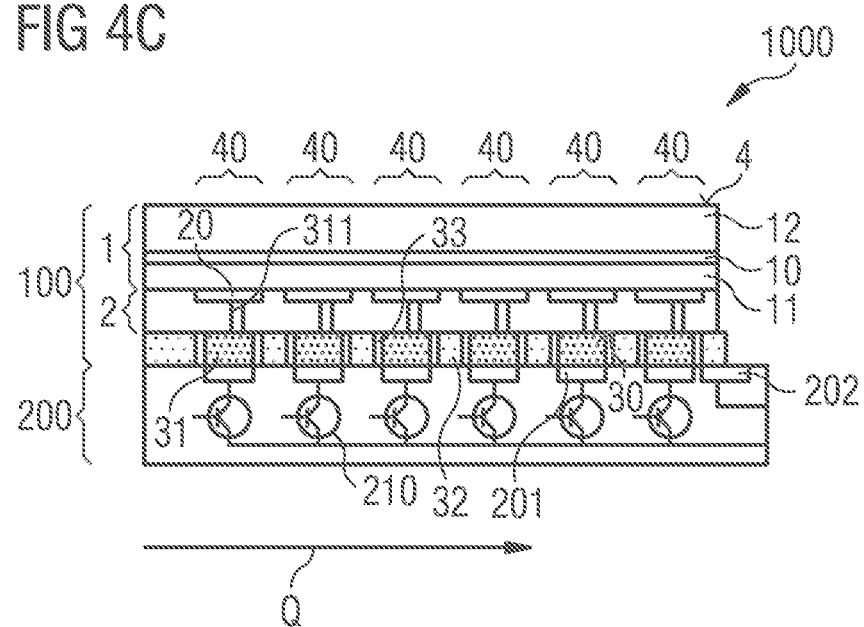

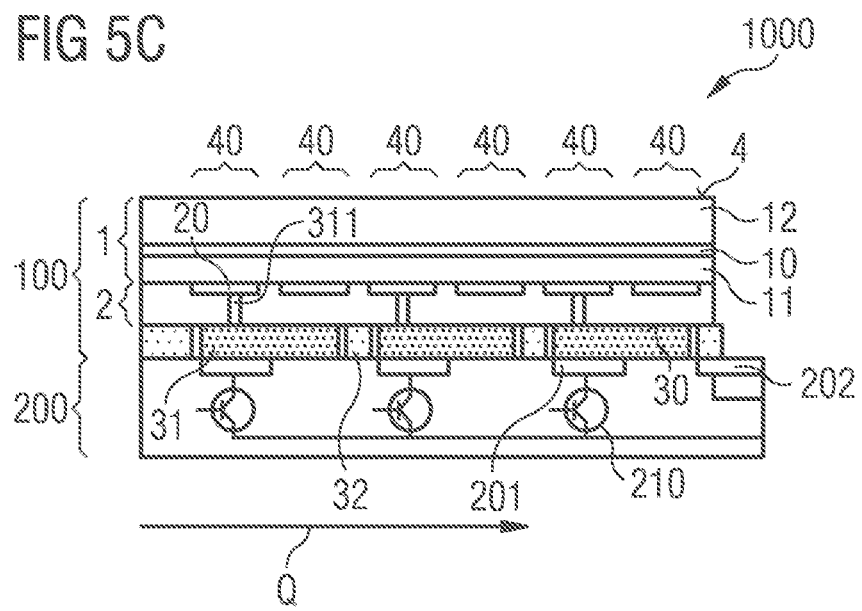
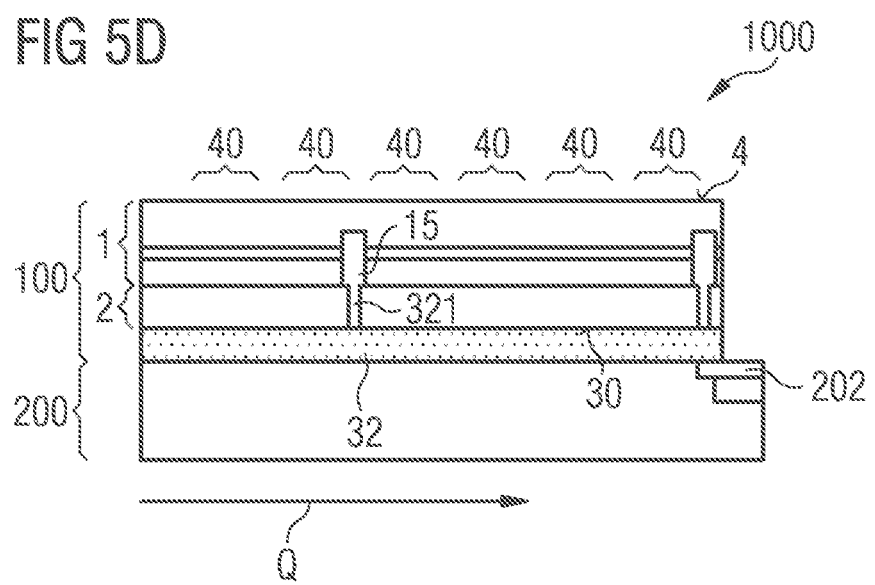

OPTOELECTRONIC COMPONENT, LIGHTING APPARATUS AND CAR HEADLIGHT

This patent application is a national phase filing under section 371 of PCT/EP2017/050083, filed Jan. 3, 2017, which claims the priority of German patent application 10 2016 100 351.4, filed Jan. 11, 2016, each of which is incorporated herein by reference in its entirety.

TECHNICAL FIELD

An optoelectronic component is specified. In addition, a lighting apparatus and a car headlight are specified.

SUMMARY OF THE INVENTION

Embodiments provide an optoelectronic component with small pixels and relatively large contact structures. Further embodiments provide a lighting apparatus and a car headlight with such an optoelectronic component.

According to at least one embodiment, the optoelectronic component comprises a radiation side, such as a pixelated radiation side, with a plurality of pixels arranged next to each other in a lateral direction, parallel to the radiation side.

The optoelectronic component is, for example, a semiconductor chip, such as a thin-film semiconductor chip. In this case, a semiconductor chip is understood as meaning such an element which is produced by singulation of a wafer. In particular, the dimensions of the semiconductor chip are thus defined by dividing lines in the wafer.

In this case, a pixel is understood to mean, in particular, a region of the radiation side which is luminous or operable during operation of the optoelectronic component and which can be operated or illuminated independently of the remaining radiation side. Each pixel can form an individual pixel. Alternatively, a plurality of pixels, for example, three pixels, such as a red shining, a green shining and a blue shining pixel, when in operation, form a parent pixel. Such a parent pixel is then also operable independently of the other parent pixels and can be colored or white depending on the color mixture.

During operation, preferably electromagnetic radiation, in particular visible light, is coupled out of the component or coupled into the component via the radiation side. In the first case the pixels are luminous points, in the second case sensor points. The radiation side can accordingly act as a screen or as an image sensor.

The pixels are preferably arranged in a matrix, for example, in a rectangular pattern, on the radiation side. For example, the pixels form meshes of a regular grid. The pixels are preferably formed simply connected in each case. The radiation-emitting partial surface of the radiation side defined by the pixel therefore preferably has no interruptions, such as non-luminous or dark-appearing spots.

Each pixel is characterized in particular by its geometric shape and its size. In plan view of the radiation side, each pixel may, for example, have a rectangular or oval or elliptical or square or circular cross-sectional shape. Particularly preferably, all the pixels have the same shape and/or size within the scope of the manufacturing tolerance.

According to at least one embodiment, the optoelectronic component comprises a contact side opposite the radiation side with a plurality of first contact structures arranged next to each other in the lateral direction for external electrical contacting of the component. The first contact structures can protrude, for example, as elevations from the contact side or can terminate flush with the contact side.

The first contact structures comprise, for example, an electrically conductive material, such as a metal, for example, Al, Ag, Ni, Cu, Sn or Au, or a transparent conductive oxide, in short TCO, or consist thereof.

In particular, the surfaces of the first contact structures that are visible when looking at the contact side are in each case designed to be contiguous or simply connected. Particularly preferably, the first contact structures are all formed substantially the same or identical. This means, for example, that the first contact structures have the same three-dimensional geometric shapes and sizes or volumes within the manufacturing tolerance. In particular, in each case two first contact structures can thus be transferred into one another almost congruently, with the resulting intersection volume amounting to at least 90% or at least 95% or at least 99% of the volume of each of the two individual first contact structures.

According to at least one embodiment, in plan view of the radiation side, the length of each pixel measured along a longitudinal direction is greater than the width of the pixel measured along a transverse direction. The longitudinal direction and the transverse direction are aligned parallel to the radiation side and perpendicular to each other. The pixels thus have, for example, rectangular or oval or elliptical basic shapes. For example, the length is at least 1.2 times or at least 1.5 times or at least 2 times larger than the width.

The lengths and/or widths of the pixels may, for example, be at most 200 µm or at most 100 µm or at most 50 µm. Alternatively or additionally, the lengths and/or widths of the pixels are at least 5 µm or at least 10 µm or at least 50 µm.

According to at least one embodiment, the first contact structures are all p-contact structures or all n-contact structures. This means that, in the normal operation of the component, either holes or electrons are injected into the optoelectronic component via all the first contact structures.

According to at least one embodiment, the first contact structures are operated individually and independently of one another during normal operation. That is, the first contact structures are not directly electrically connected to each other. Only one semiconductor layer sequence within the component can electrically connect the first contact structures to one another. In other words, the first contact structures can be energized or supplied with a voltage independently of one another.

According to at least one embodiment, each pixel is electrically uniquely associated with a first contact structure. This means, in particular, that when electrical contacting a specific first contact structure only the associated pixel is operated and controlled, for example, brought to light. The other pixels are not operated solely by contacting this first contact structure.

According to at least one embodiment, in plan view of the contact side, each first contact structure overlaps at least with the associated pixel. In this case, the first contact structure can partially or completely overlap with the associated pixel. In particular, it is possible for each first contact structure to overlap with more than one pixel, for example, with two, three, four or more neighboring pixels. Even if each first contact structure overlaps with two or more pixels in plan view of the contact side, nevertheless each first contact structure is electrically associated with only one pixel.

According to at least one embodiment, for each pixel and at least one pixel directly adjacent thereto in the transverse direction, the two first contact structures of these two pixels are arranged predeterminedly or specifically differently with respect to the associated pixels. For example, the first contact structures of the two pixels, which are directly adjacent in the transverse direction, are rotated or offset with respect to each other. In particular, this different arrangement is chosen such that a translation, in particular a pure translation in the transverse direction, which images the pixel on the pixel, which is directly adjacent in the transverse direction, does not transfer the two associated first contact structures congruently into each other.

In other words, each pixel can be mapped into a pixel, being directly adjacent in the transverse direction, via a pure translation. The two pixels are preferably imaged congruently to each other. However, it may also be that the translation can map the pixels only almost congruently to each other, because the pixels have slightly different shapes and sizes, for example, due to manufacturing tolerances. It is also possible that the pixels have, for example, in corner regions, different recesses that cannot be converted into each other by the translation. In particular, "imaging into each other" is understood to mean that the intersection surface between the two pixels resulting from the translation yields at least 90% or 95% or 99% of the areas of the individual pixels.

Correspondingly, the fact that the two associated first contact structures are not congruently transferred into each other by the translation can mean that a virtual intersection volume between the two first contact structures, resulting from the translation, is at most 90% or at most 80% or at most 50% or at most 10% or at most 5% of the volumes of the individual first contact structures. It is also possible that there is no overlapping of the two first contact structures at all due to the translation.

The pixels described here are preferably pixels in the interior of the radiation side, i.e., pixels which are not arranged on the edge of the radiation side. For example, the pixels in the interior of the radiation side are surrounded in the transverse direction and the longitudinal direction on both sides by further pixels.

In at least one embodiment, the optoelectronic component has a pixelated radiation side with a plurality of pixels arranged next to each other in a lateral direction parallel to the radiation side. A contact side lying opposite the radiation side comprises a plurality of first contact structures, which are arranged next to each other in the lateral direction and which are set up for external electrical contacting of the component. In plan view of the radiation side, the length of each pixel measured along a longitudinal direction is greater than the width of the pixel measured along a transverse direction. The first contact structures are all p-contact structures or all n-contact structures. The first contact structures are contacted individually and independently during normal operation. Each pixel is electrically uniquely associated with a first contact structure. In plan view of the contact side each first contact structure overlaps at least with the associated pixel. Furthermore, for each pixel and a pixel, which is directly adjacent in the transverse direction, the two first contact structures of these two pixels are arranged predeterminedly differently with respect to the associated pixels, so that a translation, which images the pixel onto the pixel directly adjacent in the transverse direction, does not transfer the two associated first contact congruently into each other.

The invention described herein is based in particular on the recognition that, for individually controlled pixels, the first contact structures on the contact side are usually selected according to the size of the pixels. With a reduction of the pixel size, therefore, the respective first contact structure on the contact side must also be reduced in its lateral extent. However, the production of very small contact structures for very small pixels can cause problems.

Among other things, the invention makes use of the idea of arranging the first contact structures differently with respect to the associated pixels. In particular, if the pixels are not square or circular, but elliptical, oval or rectangular, for example, the lateral extent of the first contact structures can be selected to be greater compared to the case when the first contact structures are arranged always the same with respect to the associated pixels. Thus, this makes it possible to reduce the dimensions of the pixels in particular in one direction and to leave the first contact structures on the rear side relatively large.

According to at least one embodiment, in each case, the two first contact structures of the two pixels, which are directly adjacent in the transverse direction, are arranged on different heights along or with respect to the longitudinal direction. If the pixel is imaged onto the directly adjacent pixel, for example, via a translation in the transverse direction, then, after the translation, the two associated first contact structures are offset from each other in the longitudinal direction.

According to at least one embodiment, in plan view of the contact side, each first contact structure overlaps with n, in particular with exactly n, pixels being arranged next to one another in the transverse direction.

According to at least one embodiment, in plan view of the contact side, each pixel overlaps with n, in particular with exactly n, first contact structures being arranged next to one another in the longitudinal direction.

Here and in the following n may be an integer of at least two, three, four, five, six, seven, eight, nine, ten or more.

According to at least one embodiment, in plan view of the contact side, the length and width of each first contact structure are substantially equal. Here "substantially" means that the lengths and widths of the first contact structures deviate from one another by at most 10% or at most 5% or at most 2%. In particular, in plan view of the contact side, the first contact structures may, for example, have square or circular or regular hexagonal cross-sectional shapes.

The lengths and widths of the first contact structures may, for example, be at most 200 μm or at most 100 μm or at most 50 μm. Alternatively or additionally, the lengths and/or widths of the pixels are at least 5 μm or at least 10 μm or at least 50 m.

According to at least one embodiment, for each pixel the length is substantially $n^2$ times the width, wherein n may be the above-mentioned integer. Preferably, the length and width of each first contact structure are substantially n times the width of the associated pixel. Here "substantially" means that a deviation of, for example, at most 20% or at most 10% or at most 5% or at most 1% may occur. For example, the length of the first pixel is $n^2$ times the width plus/minus 20%.

According to at least one embodiment, the first contact structures are exposed at the contact side in the unmounted state of the optoelectronic component. In this state, the first contact structures, for example, are not electrically contacted yet.

According to at least one embodiment, the first contact structures on the contact side are solder structures for the electrical and mechanical connection to a connection carrier. In the region of the first contact side, therefore, the first contact structures, for example, comprise a solder metal, such as Sn alloys, or consist thereof. In particular, a part of the first contact structures protruding from the contact side may comprise or consist of a solder metal.

According to at least one embodiment, at least one second contact structure for external electrical contacting of the component is arranged on the contact side. The second contact structure can also protrude from the contact side, be exposed in the unmounted state and be, for example, a solder structure. The second contact structure may comprise the same materials as the first contact structure.

According to at least one embodiment, the second contact structure has a polarity complementary to the first contact structures during normal operation. If the first contact structures are thus, for example, p-contact structures, then the second contact structure is an n-contact structure. The second contact structure is thus in particular a counter contact to one or more or all of the first contact structures.

According to at least one embodiment, the second contact structure is formed contiguously and has a plurality of recesses. The recesses are preferably completely surrounded by the second contact structure in plan view of the contact side.

The first contact structures are preferably arranged in the recesses of the second contact structure. In particular, a recess in the second contact structure can be uniquely associated with each first contact structure. In other words, there is a separate recess for each first contact structure. Alternatively, it is also possible that two or more first contact structures are arranged together in a recess.

According to at least one embodiment, an isolation region is provided on the contact side around each first contact structure, which electrically isolates the respective first contact structure from the second contact structure and spaces it in the lateral direction. This isolation region can be, for example, a cavity filled with air or gas. However, it is also possible that the isolation region is formed by an insulating, solid material, such as silicon oxide, for example, $SiO_2$, or silicon nitride, for example, SiN.

By way of example, the entire contact side is flat or planar, with the isolation regions between the first contact structures and the second contact structure terminating flush with the first contact structures and the second contact structure at the contact side. In particular, the contact side can be produced via a damascene process, preferably via a dual damascene process.

According to at least one embodiment, the isolation regions of two or more adjacent first contact structures are contiguous. In this case, two or more first contact structures are preferably arranged in a common recess of the second contact structure.

According to at least one embodiment, the optoelectronic component has a semiconductor layer sequence arranged between the radiation side and the contact side.

The semiconductor layer sequence is based, for example, on a III-V compound semiconductor material. The semiconductor material is, for example, a nitride compound semiconductor material, such as $Al_nIn_{1-n-m}Ga_mN$, or a phosphide compound semiconductor material, such as $Al_nIn_{1-n-m}Ga_mP$, or also an arsenide compound semiconductor material, such as $Al_nIn_{1-n-m}Ga_mAs$, where $0 \leq n \leq 1$, $0 \leq m \leq 1$ and $m+n \leq 1$, respectively. In this case, the semiconductor layer sequence can have dopants and additional constituents. For the sake of simplicity, however, only the essential constituents of the crystal lattice of the semiconductor layer sequence, i.e., Al, As, Ga, In, N or P, are indicated, even if these can be partially replaced and/or supplemented by small amounts of further substances. The semiconductor layer sequence is preferably based on AlInGaN.

According to at least one embodiment, the semiconductor layer sequence has a dielectric between the contact side and the semiconductor layer sequence. The dielectric is, for example, an insulating layer on the semiconductor layer sequence. The dielectric preferably has no stabilizing effect for the semiconductor layer sequence. The compound of semiconductor layer sequence and dielectric alone is therefore preferably not mechanically self-supporting.

The dielectric may comprise or consist of, for example, a silicone or a silicon nitride or a silicon oxide or an aluminum oxide.

According to at least one embodiment, the semiconductor layer sequence comprises a first semiconductor layer facing the dielectric, for example, a p-doped or n-doped semiconductor layer, and a second semiconductor layer, for example, an n-type or p-type semiconductor layer, facing away from the dielectric. Between the first semiconductor layer and the second semiconductor layer, an active layer is arranged. For example, the active layer emits or absorbs electromagnetic radiation during normal operation. In particular, the active layer is designed to emit radiation in the visible spectral range or UV range.

The active layer has, for example, at least one pn junction and/or one quantum well structure in the form of a single-quantum well, SQW for short, or in the form of a multi-quantum well structure, MQW for short.

According to at least one embodiment, each first contact structure has one, in particular exactly one, first connection element. The first connection element preferably extends from the contact side through the dielectric, that is to say it is a passage through the dielectric. The semiconductor layer sequence is preferably electrically conductively connected to the contact side via the first connection element. The first connection element may be, for example, a rod-shaped elevation or a spike which rises from the first contact structure in the direction of the semiconductor layer sequence. For example, the first contact structures are platelets or layers located on the contact side and having two substantially parallel and planar major sides, said first contact structures having on one of the main sides a spike or an elevation, which penetrates the dielectric.

According to at least one embodiment, the first connection elements of the two first contact structures of the directly adjacent pixels do not overlap with each other after the translation.

According to at least one embodiment, mirror elements which are in direct mechanical and electrical contact with the first semiconductor layer are arranged between the dielectric and the semiconductor layer sequence. In each case, the mirror elements are preferably formed to be simply connected and have, for example, a metal, such as Ag, Al, Au, Rh, or consist of such a metal.

According to at least one embodiment, each mirror element is uniquely associated with a first contact structure and is electrically conductively connected thereto via the first connection element. The mirror elements are preferably in direct contact with the first connection elements.

According at least one embodiment, during operation first charge carriers, such as holes or electrons, are injected into the first semiconductor layer via the entire lateral extent of the mirror elements, that is to say via the extent measured parallel to the radiation side and/or contact side.

According to at least one embodiment, the projection of the mirror elements on the radiation side in each case defines the shape, size and position of the pixels. This is achieved in particular in that a lateral current distribution within the semiconductor layer sequence is small, so that the active layer of the semiconductor layer sequence generates electromagnetic radiation only in the region directly above the mirror elements.

According to at least one embodiment, in a plan view of the radiation side, the active layer extends over a plurality of pixels and is formed contiguously.

According to at least one embodiment, the semiconductor layer sequence has vias which extend from the side of the semiconductor layer sequence facing the dielectric through the first semiconductor layer and the active layer and open into the second semiconductor layer. During operation, second charge carriers, such as electrons or holes, are preferably injected from the contact side via second connection elements of the second contact structure through the dielectric into the vias and from there into the second semiconductor layer. Contact elements or contact structures on the radiation side can then be dispensed with.

According to at least one embodiment, the vias are arranged laterally next to the pixels in a plan view of the radiation side. In particular, the vias therefore do not overlap with the pixels that are formed in a simply connected manner. The vias are arranged, for example, in the region of corners of the pixels. In this case, one or more pixels may be electrically associated to one and the same via, so that the active layer is supplied with charge carriers below one or below a plurality of pixels via the same via.

In addition, a lighting apparatus is specified. In particular, the lighting apparatus comprises an optoelectronic component described herein. All features disclosed in connection with the lighting apparatus are thus disclosed for the optoelectronic component and vice versa.

According to at least one embodiment, the lighting apparatus comprises a connection carrier with first connection points. For example, the component is supplied with current or voltage during normal operation via the connection carrier.

According to at least one embodiment, each first contact structure is uniquely associated with a first connection point and is in direct mechanical and electrical contact with the associated connection point.

According to at least one embodiment, the optoelectronic component is soldered onto the connection carrier and mechanically fastened by means of the first and/or second contact structures formed as solder structures.

According to at least one embodiment, the optoelectronic component is connected to the connection carrier by means of bonding, for example, direct bonding.

The connection carrier preferably has a stabilizing effect on the optoelectronic component or the lighting apparatus. In particular, the lighting apparatus is self-supporting.

According to at least one embodiment, a switch in the connection carrier is uniquely associated with each first contact structure. By operating the switch, the associated first contact structure can be contacted during operation and the correspondingly associated pixel can be operated. The connection carrier is, for example, an active matrix element or a silicon wafer with integrated switches, such as transistors or thin-film transistors.

According to at least one embodiment, the optoelectronic component of the lighting apparatus is free of a growth substrate. In particular, the optoelectronic component is not mechanically self-supporting.

In addition, a car headlight is specified. In particular, the car headlight has a lighting apparatus as described herein or an optoelectronic component as described herein. The optoelectronic component or the lighting apparatus is thus processed or used in the car headlight. In particular, the lighting apparatus is suitable to realize a car headlight with adaptive curve light.

The headlight is preferably designed such that the longitudinal direction is parallel or substantially parallel to the road. Correspondingly, the transverse direction is perpendicular to the road. By adding luminous pixels in the longitudinal direction a cruised curve can be illuminated. By switching on or off the luminous pixels in the transverse direction, the lighting range can be regulated. Since in this case often a high resolution of, for example, at least 0.1° is to be achieved, it is particularly advantageous to choose the extension of the pixels in the transverse direction low.

BRIEF DESCRIPTION OF THE DRAWINGS

Hereinafter, an optoelectronic component described herein, as well as a lighting apparatus described herein will be explained in more detail with reference to drawings by means of exemplary embodiments. The same reference numerals indicate the same elements in the individual figures. However, the size ratios involved are not to scale, rather individual elements may be illustrated with an exaggerated size for a better understanding.

As shown in:

FIGS. 1A to 1B, 2A to 2C, 3A to 3B and 4A to 4C show modifications of a lighting apparatus in lateral cross-sectional views and plan views;

FIGS. 5A to 5D, 6A to 6C and 7A to 7B show exemplary embodiments of a lighting apparatus in lateral cross-sectional views and plan views.

DETAILED DESCRIPTION OF ILLUSTRATIVE EMBODIMENTS

Figure 2A:
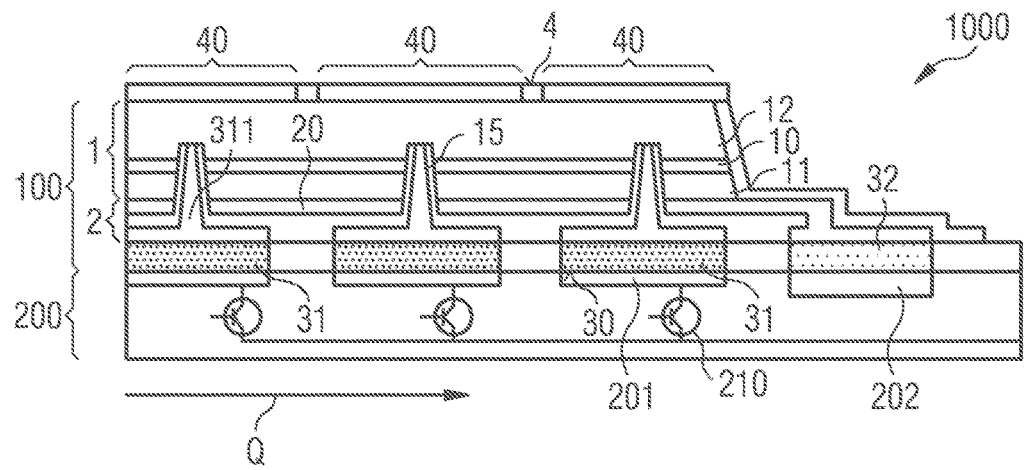

FIG. 1A shows a modification of a lighting apparatus 1000 in a lateral cross-sectional view. Evident is an optoelectronic component 100, which is arranged on a connection carrier 200. The optoelectronic component 100 itself has a semiconductor layer sequence 1 and a dielectric 2 arranged thereon. A side of the semiconductor layer sequence 1 facing away from the dielectric 2 forms a radiation side 4 of the lighting apparatus 1000. A side of the dielectric 2 facing away from the semiconductor layer sequence 1 forms a contact side 30 of the optoelectronic component 100.

The semiconductor layer sequence 1 has a first semiconductor layer 11 facing the dielectric 2, a second semiconductor layer 12 facing away from the dielectric 2 and an active layer 10 arranged therebetween. By way of example, the semiconductor layer sequence 1 is a GaN-based semiconductor layer sequence, wherein, in normal operation, the active layer 10 emits radiation in the blue spectral range or in the near UV spectral range.

On the contact side 30 of the apparatus 100, a plurality of first contact structures 31 is arranged. Between the first contact structures 31, a second contact structure 32 is attached. The first contact structures 31 are spaced from the second contact structure 32 by insolating regions 33 in the form of cavities and are electrically insolated. The first contact structures 31 and the second contact structure 32 are used for electrical contacting of the component 100 by means of the connection carrier 200. The first contact structures 31 and the second contact structure 32 are formed, for example, from a solder material, such as AgSn. Via the first contact structures 31 and the second contact structure 32, the semiconductor component 100 is soldered to the connection carrier 200 and thus mechanically connected thereto and electrically contacted.

The connection carrier 200 has first connection points 201 and one or more second connection points 202. Each first contact structure 31 is in direct electrical and mechanical contact with a uniquely associated first connection point 201. The second contact structure 32 is in direct electrical and mechanical contact with the second connection point 202.

The connection points 201, 202 in the connection carrier 200 are formed, for example, from a metallic material such as Al, Ag, Ni, Cu or Au.

Each first connection point 201 is uniquely associated to a switch 210, for example, a transistor. Via the respective switch 210, the first connection points 201 can be energized individually and independently of one another. In this way, also the first contact structures 31 of the optoelectronic component 100 can be energized individually and independently of one another.

The charge carriers reaching the first contact structures 31 via the first connection locations 201 reach through the dielectric 2 via first connection elements 311 of the first contact structures 31. The charge carriers are then injected from the first contact structures 31 into mirror elements 20, which are arranged between the dielectric 2 and the semiconductor layer sequence 1 and are in direct electrical and mechanical connection with the semiconductor layer sequence 1. In this case, each first contact structure 31 has a unique mirror element 20 assigned to it uniquely.

The mirror elements 20 are formed, for example, of silver. The charge carriers from the first contact structure 31 are then injected into the semiconductor layer sequence 1 via the mirror elements 20 and then recombine in the region of the active layer 10 with second charge carriers which are injected into the semiconductor layer sequence 1 via the second connection point 202 and the second contact structure 32. Recombination of the charge carriers in the active layer 10 takes place substantially only in the region directly above the mirror elements 20. Electromagnetic radiation is thus also generated only in the region directly above the mirror elements 20. The semiconductor layer sequence 1 or the optoelectronic component 100 then begins to shine only in the region which is defined by the mirror elements 20.

In other words, the projection of the mirror elements 20 onto the radiation surface 4 defines in each case one pixel 40 on the radiation surface 4. The pixels 40 can therefore be operated, for example, brought to illumination, individually and independently of one another via the first contact structures 31 or the first connection locations 201 or the switches 210.

The injection of the second charge carriers takes place via the second connection point 202, from where the second charge carriers enter the second contact structure 32. From the second contact structure 32, the charge carriers then pass through second connection elements 321 through the dielectric 2 into vias 15. The vias 15 extend through the first semiconductor layer 11 and the active layer 10 and open into the second semiconductor layer 12. In this region the second charge carriers from the vias 15 are injected into the second semiconductor layer 12 and can then recombine in the region of the active layer 10 with the first charge carriers.

FIG. 1B shows a plan view of the contact side 30 of the component 100 of FIG. 1A. FIG. 1A is a view of a cross-sectional plane perpendicular to the drawing surface through the dashed line AA'.

In FIG. 1B the shapes and positions of the pixels 40, which in each case are defined by the mirror elements 20, are indicated by dashed rectangles. In the area of the pixels 40, the first contact structures 31 are arranged. Each contact structure 31 is arranged in a recess of the second contact structure 32. The first contact structures 31 are spaced and electrically insulated from the second contact structure 32 by the isolation regions 33. The vias 15 are indicated by the dotted circles and are also arranged in the area of the pixels 40. The vias 15 may form dark appearing areas within the pixels 40 during operation.

Furthermore, it can be seen in FIG. 1B that each pixel 40 can be imaged onto a directly adjacent pixel 40 by a translation, for example, a pure translation in the transverse direction Q. By the same translation, the first contact structures 31 can be mapped into each other. The first contact structures 31 are therefore translation-invariant under a translation which converts the adjacent pixels 40 into each other.

FIG. 2A shows a further modification of a lighting apparatus 1000. In contrast to FIG. 1A, the first contact structures 31 are now electrically conductively connected to vias 15 extending through the semiconductor layer sequence 1. In addition, in FIG. 2A, a common mirror element 20 is assigned to a plurality of pixels 40. In this case, the mirror element 20 does not define the shape, size and position of the pixels 40.

Figure 2B:
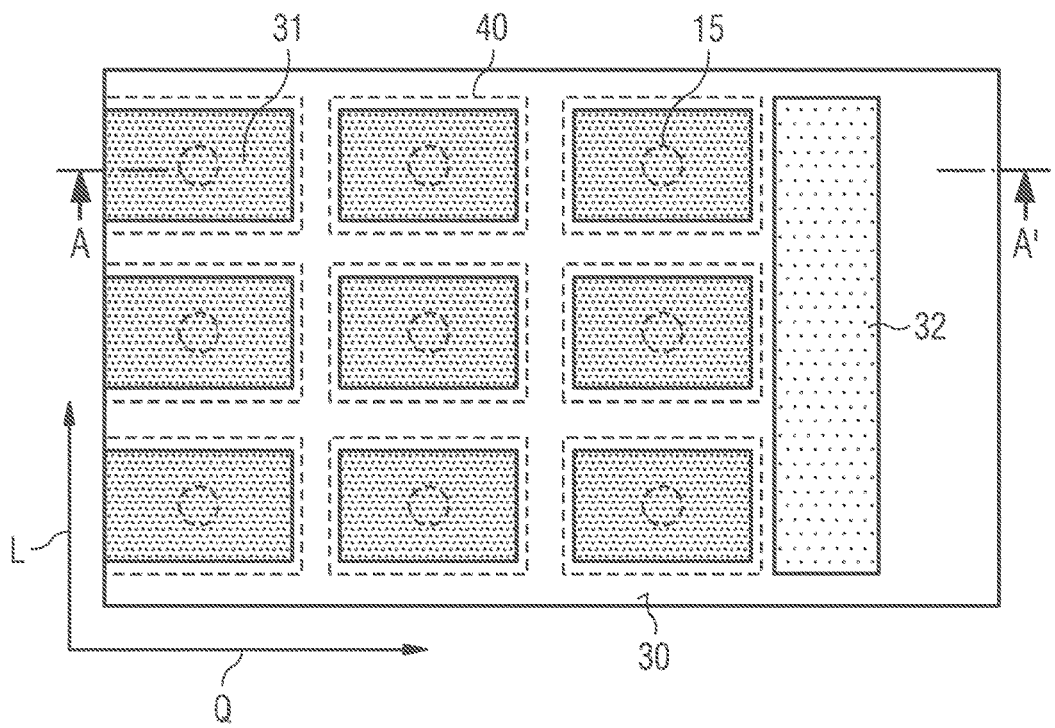

In FIG. 2B, a plan view of the contact side 30 is shown again. In contrast to FIG. 1A, the first contact structures 31 are square or rectangular. The first contact structures 31 are also not arranged in recesses of the second contact structures 32, but the second contact structure 32 is formed in an edge region of the contact side 30.

As in FIG. 1B, it can be seen in FIG. 2B that a translation which transfers adjacent pixels 40 into one another simultaneously transfers the first contact structures 31 into one another. Also here, there is an invariance of the first contact structures 31 with respect to a translation transferring the pixels 40 into one another.

Figure 2C:
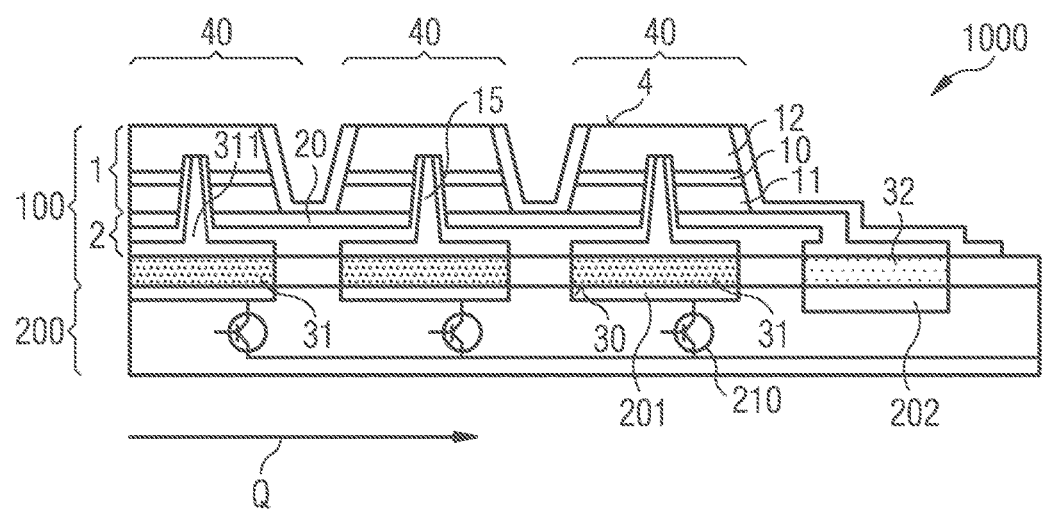

FIG. 2C shows a further modification of a lighting apparatus 1000. The lighting apparatus 1000 is similar to the lighting apparatus of FIG. 2A. Unlike in FIG. 2A, however, in regions between adjacent pixels 40, a trench is in each case introduced from the radiation side 4 into the semiconductor layer sequence 1. As a result, the contrast ratio of adjacent pixels 40 is increased in comparison to FIG. 2A.

Figure 3A:
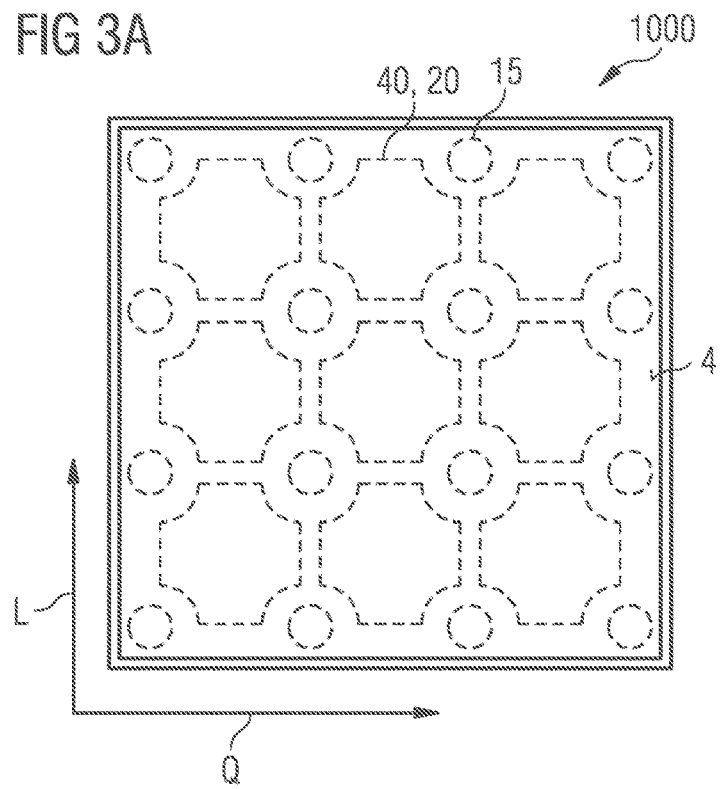

FIG. 3A shows a further modification of a lighting apparatus 1000 in view of the radiation side 4. Unlike in the previous figures, the vias 15 are now not arranged in the interior of the pixels 40, but are displaced to corner regions of the pixels 40. A plurality of pixels 40 is assigned to each via 15. By arranging the via 15 in the region of the corners of the pixels 40, the pixels 40 have recesses in the region of the corners.

The arrangement of the vias 15 outside the pixels 40 offers, inter alia, the advantage that the dark-appearing regions produced by the vias 15 are not located within the pixels 40. In this way, each pixel 40 is a simply connected luminous area.

Figure 3B:
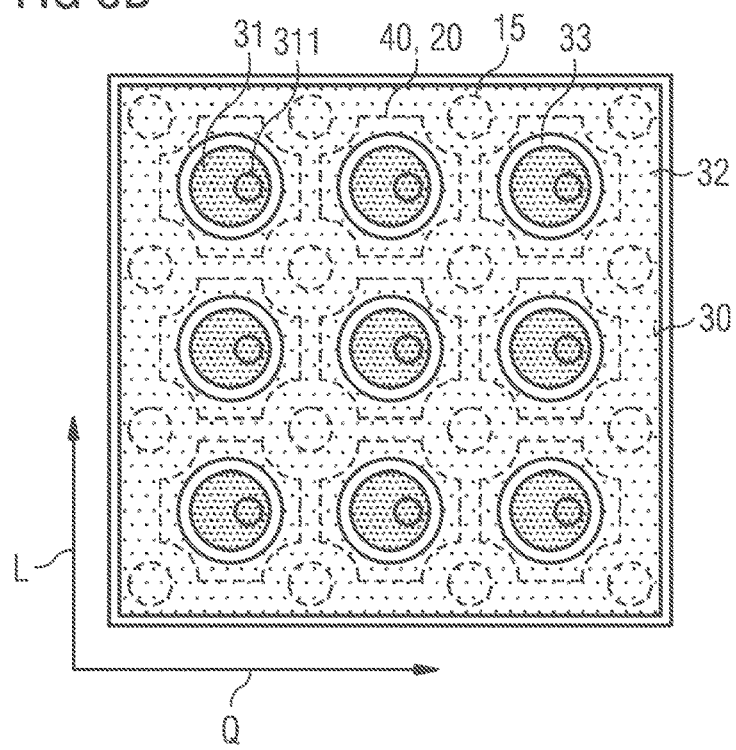

FIG. 3B shows a plan view of the contact side 30 of the lighting apparatus 1000 of FIG. 3A. The first contact structures 31 are again of circular shape and are arranged in the center of the pixels 40. The first connection elements 311 are indicated by solid circles. Once again, it can be seen that the first contact structures 31 with the connection elements 311 are translation-invariant under a translation which transfers the pixels 40 into one another.

Figure 4A:
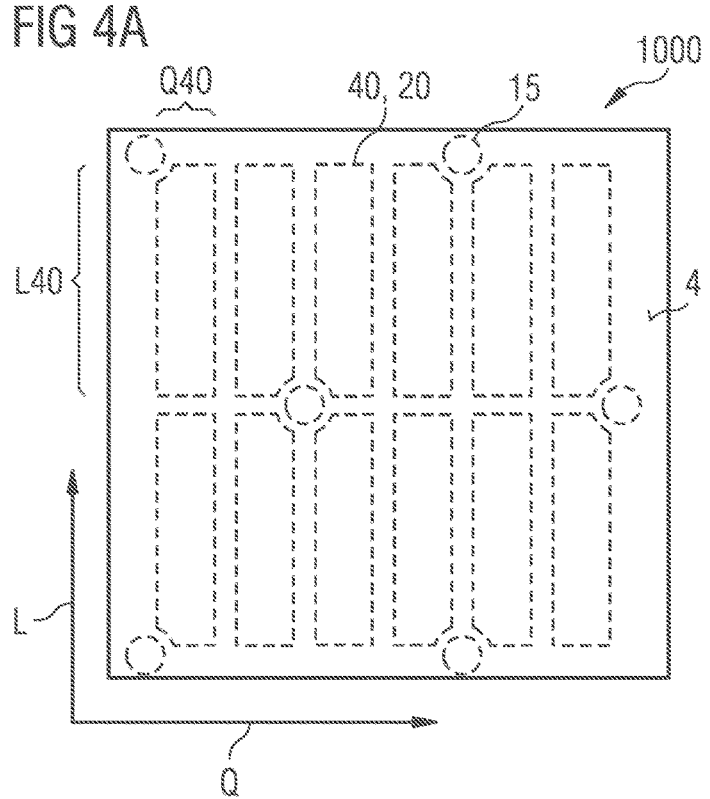

FIG. 4A shows a further modification of a lighting apparatus 1000 in a plan view of the radiation side 4. Unlike the previous lighting apparatus 1000, the pixels 40 are now no longer square, but rectangular in shape. In particular, the length L40 of each luminous area 40 along a longitudinal direction L is greater than the width Q40 along a transverse direction Q measured perpendicular to the longitudinal direction L. The vias 15 are arranged again in the region of corners of the pixels 40. In the present case, the length L40 of the pixels 40 is approximately four times the width Q40 of the pixels 40.

Figure 4B:
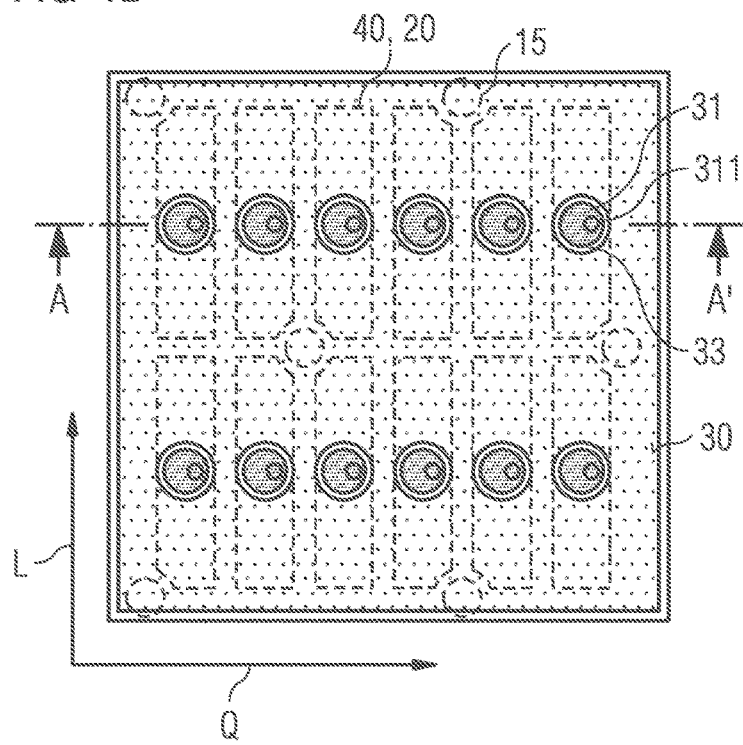

FIG. 4B shows a plan view of the contact side 30 of the lighting apparatus of FIG. 4A. The first contact structures 31 are in each case arranged in the center of the pixels 40. The pixels 40 and the first contact structures 31 with the associated connection elements 311 can be transferred into one another via the same translation.

FIG. 4C again shows a cross-sectional view along the line A-A' through FIG. 4B.

An important finding from FIGS. 4A and 4B is that by reducing the dimensions of the pixels in one direction, in the present case in the transverse direction Q, the first contact structures 33 must also be correspondingly reduced in their extent. This can eventually lead to problems because a required minimum width of the isolation regions 33, for example, at least 15 µm, then cannot be complied with easily. Also, the first contact structures 31 and the recesses within the second contact structure 32 cannot be made arbitrarily small.

The following exemplary embodiments of the invention described herein show, inter alia, ways of at least partially circumventing this problem.

Figure 5A:
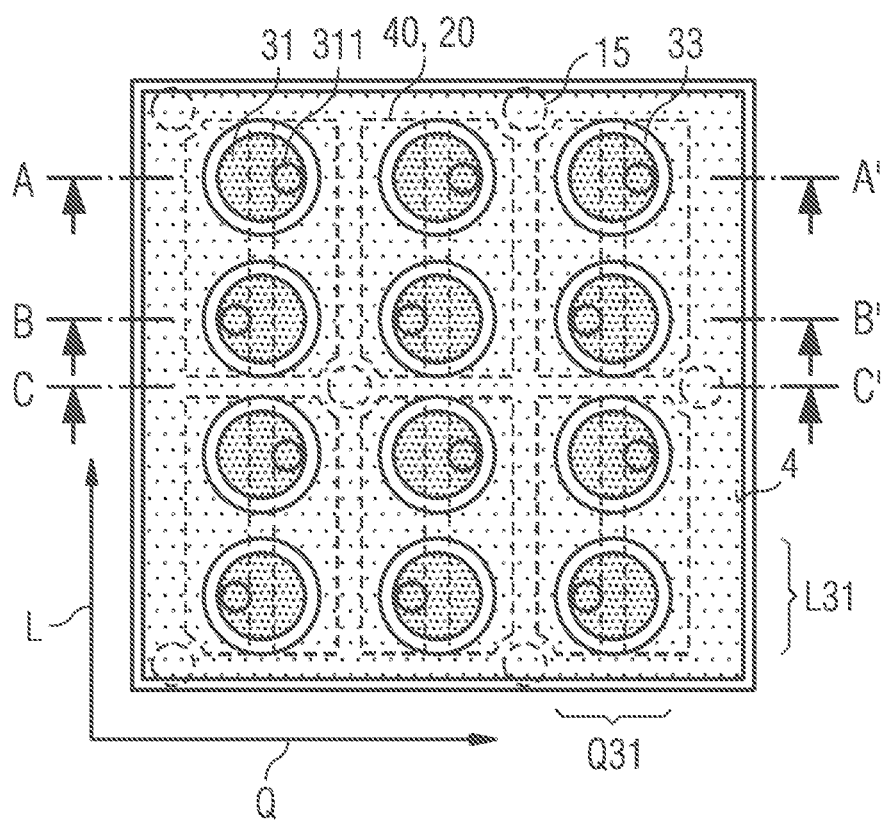

FIG. 5A shows the plan view of a contact side 30 of an exemplary embodiment of a lighting apparatus 1000 described herein or of an optoelectronic component 100 described herein. The associated luminous area 4 corresponds to the luminous area 4 from FIG. 4A. However, the contact side 30 is configured differently than shown in FIG. 4B. In particular, each first contact structure 31 overlaps here with two pixels 40 arranged next to one another in the transverse direction Q. The first contact structures 31 of two pixels 40 directly adjacent to one another in the transverse direction Q are displaced or offset from one another in the longitudinal direction L.

Although each first contact structure 31 overlaps with two pixels 40, nevertheless, each first contact structure 31 is uniquely associated with only one pixel 40. The one-to-one assignment results from the first connection element 311, which is arranged in each case only in the region of one pixel 40. Only via this first connection element 311 an electrical contact or control of the pixel 40 takes place.

Since each first contact structure 31 overlaps with two directly adjacent pixels 40, the lateral extent, that is to say the length L31 and the width Q31, of the first contact structures 31 can be increased in comparison to the first contact structures 31 of FIG. 4B. As a consequence, it also follows that a translation, which transfers pixels 40 directly adjacent in the transverse direction Q into each other, does not map the associated first contact structures 31 congruently to one another.

Figure 5B:
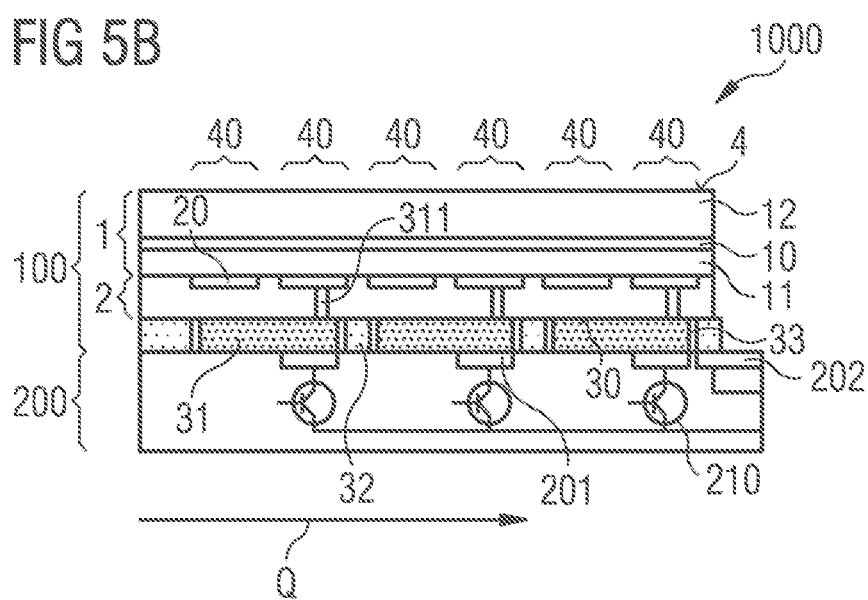

FIG. 5B shows an exemplary embodiment of a lighting apparatus 1000 described herein in plan view of the cross-sectional plane through the line AA' of FIG. 5A. It can be seen that each first contact structure 31 overlaps with two mirror elements 20 in the vertical direction, transversely to the contact side 30, but said first contact structure 31 is electrically contacted to only one mirror element 20 via the first connection element 311. Only this mirror element 20 is energized via the first contact structure 31 and, accordingly, only the pixel 40 defined by the mirror element 20 begins to shine.

In FIG. 5C, the same lighting apparatus 1000 is shown as in FIG. 5B, this time, however, in plan view of the cross-sectional plane through the line BB'. Here, the first connection elements 311 are correspondingly electrically conductively connected to the other mirror elements 20.

In FIG. 5D, the lighting apparatus 1000 is shown in a plan view of the cross-sectional plane through the line CC' of FIG. 5A. In particular, the vias 15 can be seen here, which are electrically conductively connected via the second connection elements 321 to the second contact structure 32.

Figure 6A:
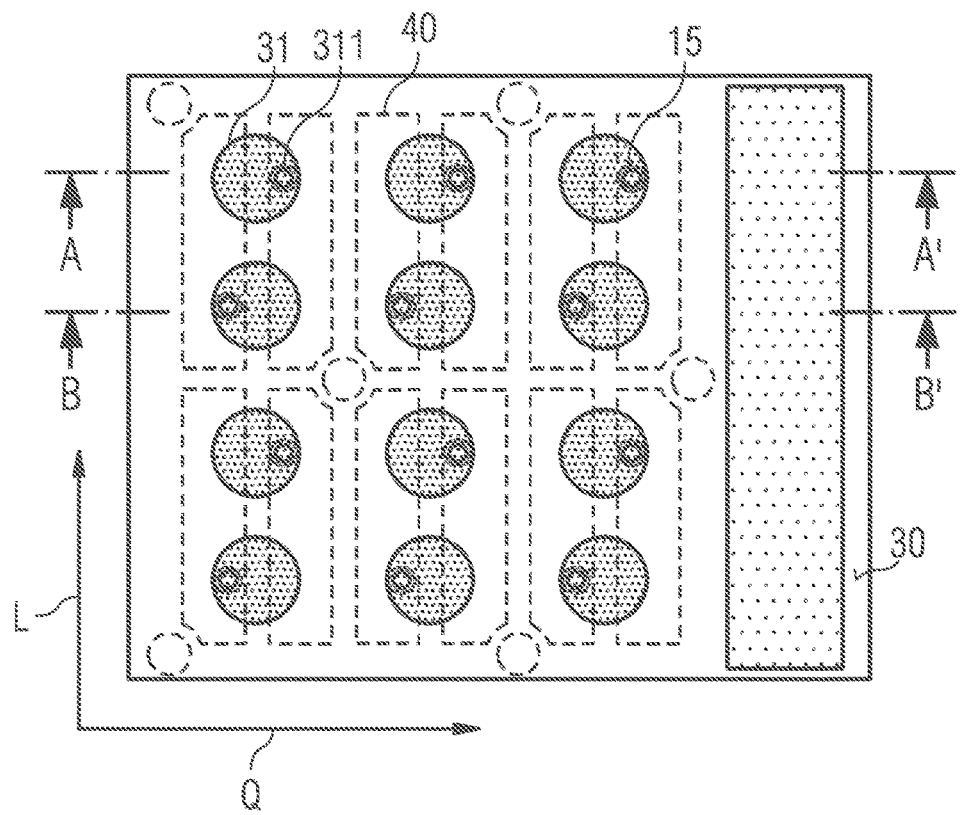

FIG. 6A shows an exemplary embodiment of a lighting apparatus 1000 or an optoelectronic component 100, again in plan view of the contact side 30. Unlike in the previous exemplary embodiment, the first contact structures 31 are now electrically conductively connected to the vias 15, so that the second semiconductor layer 12 facing away from the connection carrier 200 is contacted via the first contact structures 31. However, in order to achieve this, the vias 15 are shifted back into the interior of the pixels 40. As in the previous exemplary embodiments, a translation which images two pixels 40 which are directly adjacent in the transverse direction does not lead to any congruent imaging of the associated first contact structures 31. However, such an arrangement in turn allows large first contact structures 31.

Figure 6B:
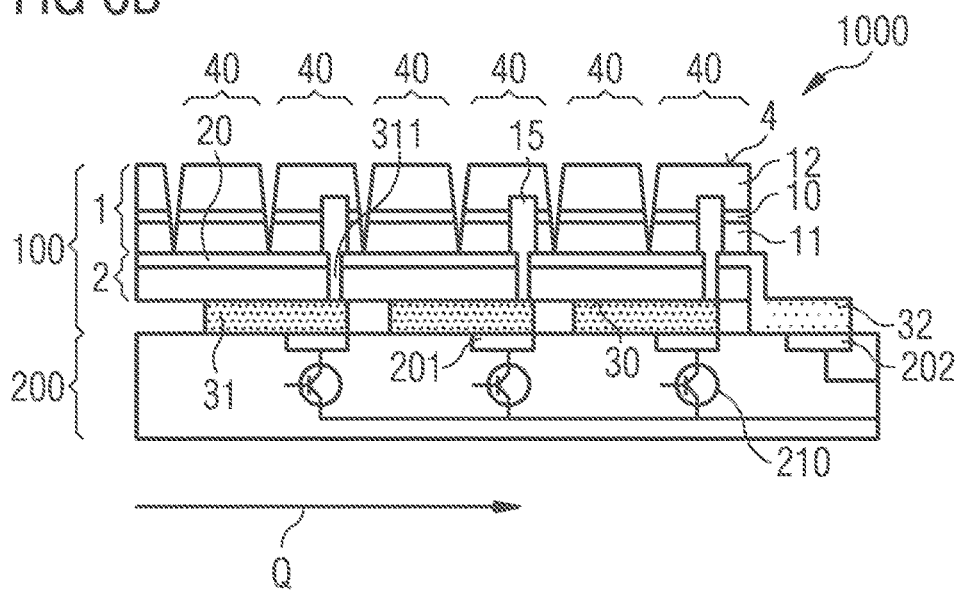

In FIG. 6B, the lighting apparatus 1000 is shown in a plan view of the cross-sectional plane through the line AA' of FIG. 6A. To increase the contrast ratio in this exemplary embodiment, trenches are introduced from the radiation side 4 into the semiconductor layer sequence 1 between two adjacent pixels 40. It can also be seen that, during operation, the first contact structures 31 inject first charge carriers into the second semiconductor layer 12 of the semiconductor layer sequence 1 via the first connection elements 311.

Figure 6C:
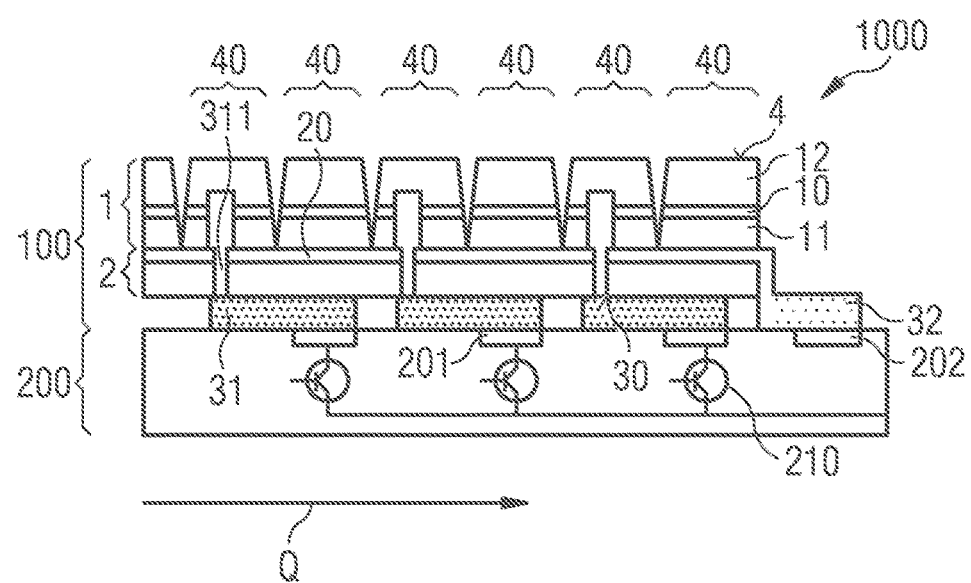

FIG. 6C shows a plan view of the cross-sectional plane through the line BB'.

Figure 7A:
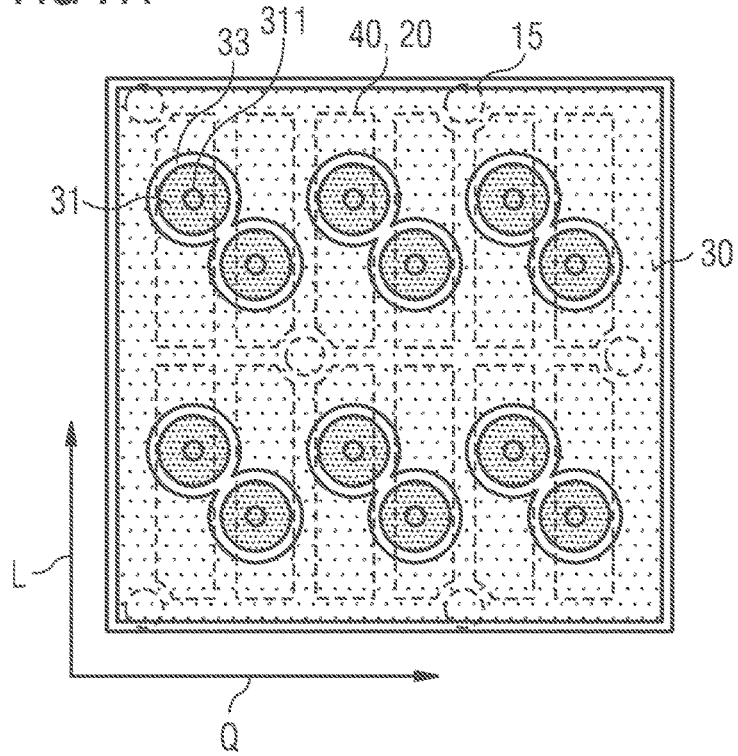
Figure 7B:
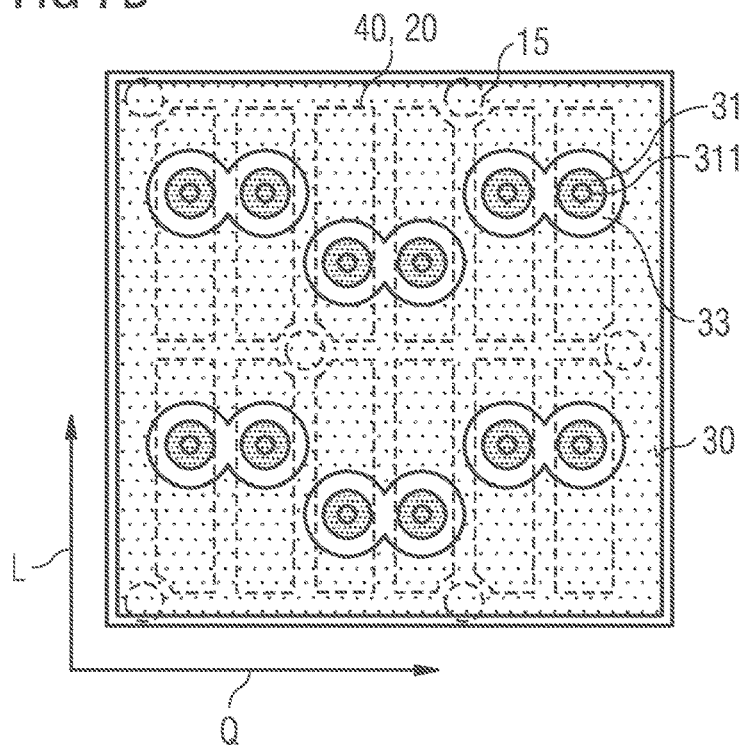

In the exemplary embodiments of FIGS. 7A and 7B, plan views of the contact side 30 of further exemplary embodiments of optoelectronic components 100 or lighting apparatus 1000 described herein are shown. Unlike in the previous exemplary embodiments, the first contact structures 31 here do not overlap with two or more adjacent pixels 40. However, the isolation regions 33 around two adjacent first contact structures 31 are implemented as a contiguous isolation region 33. As a result, the extent of the first contact structures 31 can be increased again in comparison to FIG. 4B. This effect is enhanced in FIG. 7A by the fact that the first contact structures 31 of pixels 40 which are directly adjacent in the transverse direction Q are offset from one another in the longitudinal direction L. As a result, the dimensions of the first contact structures 31 can be further increased.

In FIG. 7B, the first contact structures 31 are not arranged centrally in the pixels 40 with respect to the transverse direction Q, but offset. This also makes it possible to increase the size of the first contact structures 31. As a consequence of this, however, a translation which transfers two directly adjacent pixels 40 into one another is not suitable for mapping two directly adjacent first contact structures 31 congruently to one another.

Figure 8A:
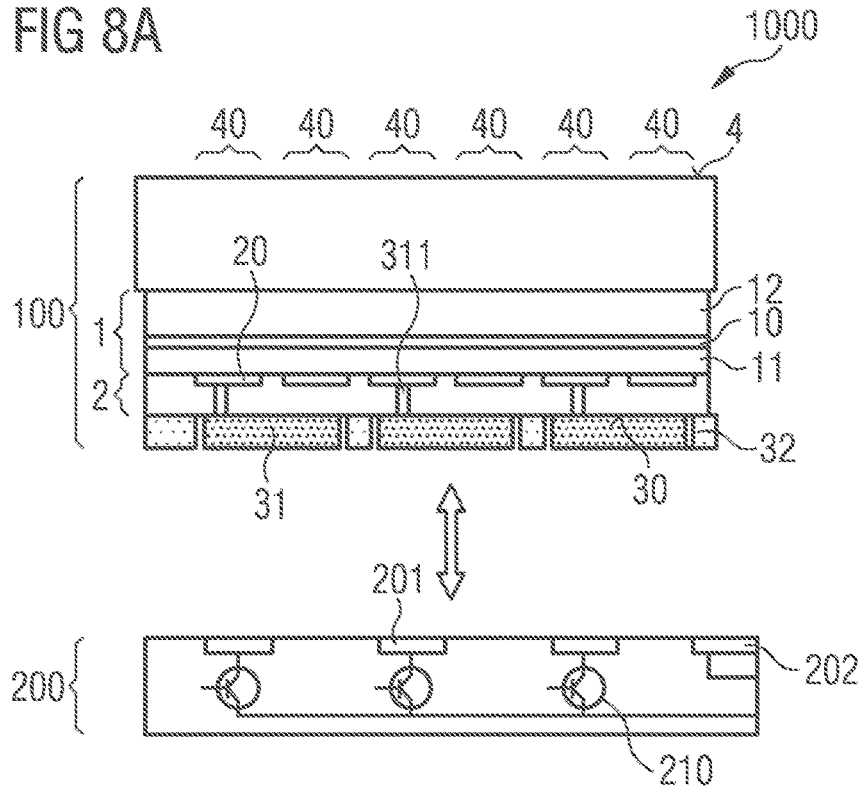
FIGS. 8A to 8B show exemplary embodiments of optoelectronic components in lateral cross-sectional views.

A cross-sectional view of an optoelectronic component 100 is shown in FIG. 8A before it is applied to the connection carrier 200, in particular soldered. It can be seen here that the contact structures 31, 32 are solder structures on the contact side 30. The connection carrier 200 is free of solder structures before application. In addition, it can be seen in FIG. 8A that, on a side of the semiconductor layer sequence 1 facing away from the contact side 30, a growth substrate for the semiconductor layer sequence 1 is applied. This growth substrate can be removed after the application of the optoelectronic component 100 to the connection carrier 200. The growth substrate is, for example, a sapphire substrate.

Figure 8B:
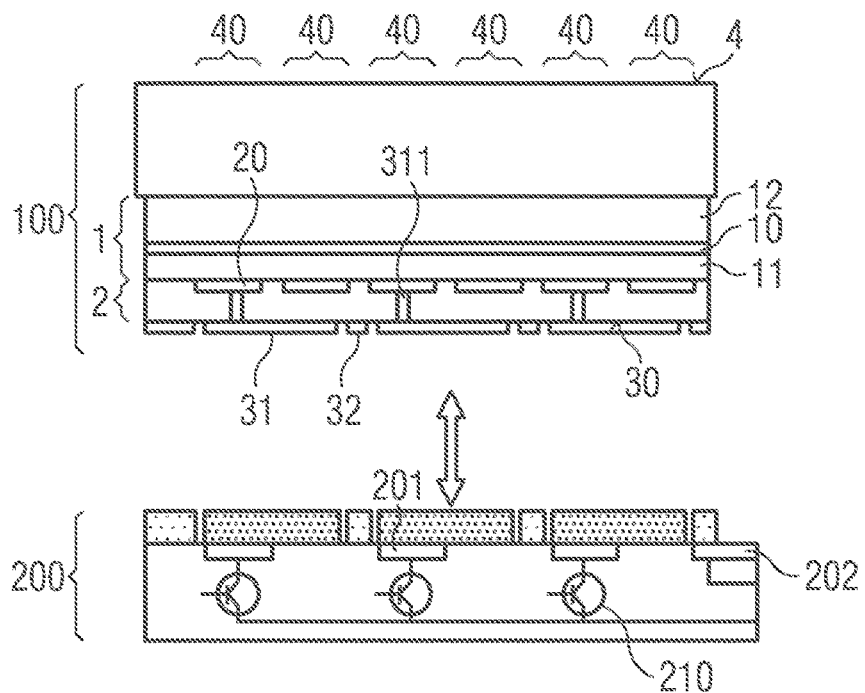

In the exemplary embodiment of FIG. 8B, unlike in FIG. 8A, the solder structures are not applied to the component 100 but to the connection carrier 200. In this case, the first contact structures 31 and the second contact structure 32 on the contact side 30 of the component 100 are not solder structures, but, for example, metallic contact elements that are applied galvanically to the optoelectronic component 100.

The invention described herein is not limited by the description in conjunction with the exemplary embodiments. Rather, the invention comprises any new feature as well as any combination of features, particularly including any combination of features in the patent claims, even if said feature or said combination per se is not explicitly stated in the patent claims or exemplary embodiments.

The invention claimed is:

1. An optoelectronic component comprising:
a radiation side having a plurality of pixels arranged next to each other in a lateral direction, parallel to the radiation side; and
a contact side opposite of the radiation side having a plurality of first contact structures for external electrical contacting of the component arranged next to each other in the lateral direction,
wherein, in a plan view of the radiation side, a length of each pixel, measured along a longitudinal direction, is greater than a width of the pixel, measured along a transverse direction,
wherein the first contact structures are either all p-contact structures or all n-contact structures,
wherein the first contact structures are electrically contacted individually and independently of each other during operation,
wherein each pixel is electrically uniquely associated with a first contact structure,
wherein, in plan view of the contact side, each first contact structure overlaps at least with the associated pixel,
wherein, for each pixel and a pixel directly adjacent thereto in the transverse direction, the two first contact structures of these two pixels are arranged differently with respect to the associated pixels so that a translation, which images the pixel in the directly adjacent pixel, does not image the two associated first contact structures congruently into each other.

2. The optoelectronic component according to claim 1, wherein, in each case the two first contact structures of the two pixels, which are adjacent in the transverse direction, are arranged at different heights along the longitudinal direction.

3. The optoelectronic component according to claim 1, wherein, in plan view of the contact side, each first contact structure overlaps with n pixels being arranged next to each other in the transverse direction,
wherein, in plan view of the contact side, each pixel overlaps with n first contact structures being arranged next to each other in the longitudinal direction, and
wherein n is an integer of at least 2.

4. The optoelectronic component according to claim 1, wherein, in plan view of the contact side, a length and a width of each first contact structure are substantially equal.

5. The optoelectronic component according to claim 4, wherein, for each pixel, the length is substantially $n^2$ times the width,
wherein, for each first contact structure, the length and the width are substantially equal to n times the width of the pixel.

6. The optoelectronic component according to claim 1, wherein, in an unmounted state of the optoelectronic component, the first contact structures are exposed, and wherein the first contact structures are solder structures configured for electrical and mechanical connection to a connection carrier.

7. The optoelectronic component according to claim 1, further comprising at least one second contact structure for external contacting of the component, wherein the at least one second contact structure is arranged on the contact side, wherein the second contact structure has a polarity that is complementary to that of the first contact structures, and wherein the second contact structure forms a counter contact to one or more of the first contact structures.

8. The optoelectronic component according to claim 7, wherein the second contact structure is formed contiguously and has a plurality of recesses,
wherein the first contact structures are arranged in the recesses of the second contact structure, and
wherein an isolation region, which electrically isolates and laterally spaces the respective first contact structure from the second contact structure, is provided on the contact side around each first contact structure.

9. The optoelectronic component according to claim 8, wherein the isolation regions of two or more adjacent first contact structures are contiguous.

10. The optoelectronic component according to claim 1, further comprising:
a semiconductor layer sequence arranged between the radiation side and the contact side; and
a dielectric between the contact side and the semiconductor layer sequence,
wherein the semiconductor layer sequence comprises a first semiconductor layer facing the dielectric, a second semiconductor layer facing away from the dielectric and an active layer arranged between the first semiconductor layer and the second semiconductor layer,
wherein the active layer emits or absorbs electromagnetic radiation during operation,
wherein each first contact structure has a first connection element which extends from the contact side through the dielectric,
wherein the semiconductor layer sequence is electrically connected with the contact side via the first connection element, and
wherein, after the translation, the first connection elements of the two first contact structures do not overlap with each other.

11. The optoelectronic component according to claim 10, further comprising mirror elements,
wherein the mirror elements are in direct mechanical and electrical contact with the first semiconductor layer and are arranged between the dielectric and the semiconductor layer sequence,
wherein a first contact structure is uniquely associated with each mirror element and is electrically conductively connected thereto via the first connection element, wherein, during operation, first charge carriers are injected into the first semiconductor layer via the entire lateral extent of the mirror elements, and wherein, a projection of the mirror elements on the radiation side in each case defines a shape, a size and a position of the pixels.

12. The optoelectronic component according to claim 10, wherein, in plan view of the radiation side, the active layer extends over a plurality of pixels and is formed contiguously.

13. The Optoelectronic component according to claim 10, wherein the semiconductor layer sequence has vias, which extend from a side of the semiconductor layer sequence facing the dielectric through the first semiconductor layer and the active layer and open into the second semiconductor layer, wherein, in plan view of the radiation side, the vias are arranged laterally next to the pixels, wherein, during operation, second charge carriers are injected from the contact side via second connection elements of a second contact structure through the dielectric into the vias and from there into the second semiconductor layer.

14. A lighting device comprising:

the optoelectronic component according to claim 1; and a connection carrier with first connection points, wherein, in each case, the first contact structures are uniquely associated with a first connection point and are in direct mechanical and electrical contact with the associated connection point.

15. The lighting device according to claim 14, wherein the optoelectronic component is soldered and mechanically fastened to the connection carrier by the first contact structures formed as solder structures.

16. The lighting device according to claim 14, wherein the optoelectronic component is connected to the connection carrier by direct bonding.

17. The lighting device according to claim 14, further comprising a switch located in the connection carrier, wherein the switch is uniquely associated with each first contact structure, and wherein the switch is configured to operate the corresponding associated pixel.

18. The lighting device according to claim 14, wherein the optoelectronic component is free of a growth substrate and is not mechanically self-supporting.

19. A car headlight with the lighting device according to claim 14.

* * * * *